United States Patent
Daley et al.

(10) Patent No.: US 9,087,717 B2
(45) Date of Patent: Jul. 21, 2015

(54) TUNNEL FIELD-EFFECT TRANSISTORS WITH A GATE-SWING BROKEN-GAP HETEROSTRUCTURE

(71) Applicant: International Business Machines Corporation, Armonk, NY (US)

(72) Inventors: Douglas M. Daley, Wiltshire (GB); Hung H. Tran, Hopewell Junction, NY (US); Wayne H. Woods, Jr., Burlington, VT (US); Ze Zhang, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/554,766

(22) Filed: Nov. 26, 2014

(65) Prior Publication Data

US 2015/0084091 A1  Mar. 26, 2015

Related U.S. Application Data

(62) Division of application No. 13/937,622, filed on Jul. 9, 2013, now Pat. No. 8,975,123.

(51) Int. Cl.
*H01L 21/335* (2006.01)
*H01L 27/088* (2006.01)
*G06F 17/50* (2006.01)
*H01L 29/66* (2006.01)
*H01L 29/08* (2006.01)
(Continued)

(52) U.S. Cl.
CPC .......... *H01L 27/088* (2013.01); *G06F 17/5045* (2013.01); *H01L 29/0895* (2013.01); *H01L 29/205* (2013.01); *H01L 29/66977* (2013.01); *H01L 29/7827* (2013.01)

(58) Field of Classification Search
CPC .............................. H01L 39/146; H01L 45/00
USPC ............ 257/39, 9, 30, E21.002; 438/50, 142, 438/263, 237
See application file for complete search history.

(56) References Cited

U.S. PATENT DOCUMENTS 5,589,696 A  12/1996  Baba
6,635,907 B1  10/2003  Nguyen et al.
(Continued)

OTHER PUBLICATIONS

A. C. Seabaugh et al., "Low-voltage tunnel transistors for beyond CMOS logic," Proceedings of the IEEE, vol. 98, No. 12, 2010, pp. 2095-2110.
(Continued)

*Primary Examiner* — Jami M Valentine
(74) *Attorney, Agent, or Firm* — Wood, Herron & Evans, LLP; Anthony J. Canale

(57) ABSTRACT

Device structures, fabrication methods, and design structures for tunnel field-effect transistors. A drain comprised of a first semiconductor material having a first band gap and a source comprised of a second semiconductor material having a second band gap are formed. A tunnel barrier is formed between the source and the drain. The second semiconductor material exhibits a broken-gap energy band alignment with the first semiconductor material. The tunnel barrier is comprised of a third semiconductor material with a third band gap larger than the first band gap and larger than the second band gap. The third band gap is configured to bend under an external bias to assist in aligning a first energy band of the first semiconductor material with a second energy band of the second semiconductor material.

12 Claims, 16 Drawing Sheets

(51) Int. Cl.
*H01L 29/205* (2006.01)
*H01L 29/78* (2006.01)

(56) References Cited

U.S. PATENT DOCUMENTS

| | | | |
|---|---|---|---|
| 7,170,105 | B1 | 1/2007 | Schulman et al. |
| 7,425,491 | B2 | 9/2008 | Forbes |
| 7,446,372 | B2 | 11/2008 | Forbes |
| 7,491,995 | B2 | 2/2009 | Forbes |
| 7,700,466 | B2 | 4/2010 | Booth, Jr. et al. |
| 7,700,969 | B1 | 4/2010 | Schulman et al. |
| 7,791,108 | B2 | 9/2010 | Hurkx et al. |
| 7,812,370 | B2 | 10/2010 | Bhuwalka et al. |
| 7,839,209 | B2 | 11/2010 | Curatola et al. |
| 8,026,509 | B2 | 9/2011 | Goel et al. |
| 8,072,012 | B2 | 12/2011 | Verhulst et al. |
| 8,120,115 | B2 | 2/2012 | Vandenberghe et al. |
| 8,258,031 | B2 | 9/2012 | Lauer et al. |
| 8,263,477 | B2 | 9/2012 | Bangsaruntip et al. |
| 2005/0274992 | A1 | 12/2005 | Appenzeller et al. |
| 2007/0178650 | A1 | 8/2007 | Chen et al. |
| 2008/0050881 | A1 | 2/2008 | Chen et al. |
| 2008/0067607 | A1 | 3/2008 | Verhulst et al. |
| 2008/0073641 | A1* | 3/2008 | Cheng et al. ............ 257/25 |
| 2012/0032227 | A1* | 2/2012 | Seabaugh et al. ............ 257/105 |

OTHER PUBLICATIONS

Y. Khatami et al.,"Steep subthreshold slope n-and p-type tunnel-FET devices for low-power and energy-efficient digital circuits," IEEE Transactions on Electron Devices, vol. 56, No. 11, 2009, pp. 2752-2761.

M. Born et al., "Tunnel FET: A CMOS device for high temperature applications," 25th International Conference on Microelectronics, 2006, pp. 124-127.

A. S. Verhulst et al., "Complementary silicon-based heterostructure tunnel-FETs with high tunnel rates," IEEE Electron Device Letters, vol. 29, No. 12, 2008, pp. 1398-1401.

J. Knoch et al., "Modeling of high-performance p-type III-V heterojunction tunnel FETs," IEEE Electron Device Letters, vol. 31, No. 4, 2010, pp. 305-307.

Q. Zhang et al., "A unique photoemission method to measure semiconductor heterojunction band offsets," Applied Physics Letters, vol. 102, No. 1, 2013, Jan. 21, 2001, 4 pages.

Zhang, "Sub-Micron Area Heterojunction Backward Diode Millimeter-Wave Detectors With 0.18 Noise Equivalent Power", IEEE Micro. Wireless Comp. Lett. 2011 vol. 21.

J M Valentine, Examiner, USPTO, Notice of Allowance issued in application No. 131937,622 dated Oct. 27, 2014.

* cited by examiner

TUNNEL FIELD-EFFECT TRANSISTORS WITH A GATE-SWING BROKEN-GAP HETEROSTRUCTURE

BACKGROUND

The present invention relates generally to semiconductor device fabrication and, in particular, to device structures for tunnel field-effect transistors, fabrication methods for tunnel field-effect transistors, and design structures for tunnel field-effect transistors.

Field-effect transistors are widely used in the electronics industry for switching, amplification, filtering, and other applications related to both analog and digital electrical signals. Complementary Metal Oxide Semiconductor (CMOS) technology, which is the prevailing technology used in integrated circuit fabrication, integrates n-channel and p-channel field-effect transistors to fabricate logic and other circuitry. The most common CMOS technology is based upon silicon.

Continuing trends in semiconductor device manufacturing include reduction in electrical device feature sizes (i.e., scaling), as well as improvements in device performance in terms of device switching speed and power consumption. The performance of field-effect transistors may be improved by reducing the distance between the source and drain, and by reducing the thickness of the layer of gate dielectric. However, there are electrical and physical limitations on the extent to which these parameters may be scaled. As scaling of silicon-based CMOS technology approaches its physical limit, the demand for energy efficient, high-speed and highly compact computing technology has accelerated the search for an alternative.

One such alternative is a tunnel field-effect transistor, which is based on ultrathin films and band-to-band tunneling in which a valence band electron tunnels across the band gap to the conduction band without the involvement of traps. Tunnel field-effect transistors may exhibit a reduced power dissipation compared to CMOS field-effect transistors, thus making tunnel field-effect transistors a promising successor to traditional CMOS field-effect transistor.

Improved device structures, fabrication methods, and design structures are needed for tunnel field-effect transistors.

SUMMARY

In an embodiment of the invention, a method is provided for fabricating a device structure. The method includes forming a drain comprised of a first semiconductor material having a first band gap, forming a source comprised of a second semiconductor material having a second band gap and forming a tunnel barrier between the source and the drain. The second semiconductor material exhibits a broken-gap alignment with the first semiconductor material. The tunnel barrier is comprised of a third semiconductor material with a third band gap larger than the first band gap and larger than the second band gap. The third band gap is configured to bend under an external bias to assist in aligning a first energy band of the first semiconductor material with a second energy band of the second semiconductor material.

In an embodiment of the invention, a device structure includes a drain comprised of a first semiconductor material having a first band gap, a source comprised of a second semiconductor material having a second band gap, and a tunnel barrier between the source and the drain. The second semiconductor material exhibits a broken-gap alignment with the first semiconductor material. The tunnel barrier is comprised of a third semiconductor material with a third band gap larger than the first band gap and larger than the second band gap. The third band gap is configured to bend under an external bias to assist in aligning a first energy band of the first semiconductor material with a second energy band of the second semiconductor material.

In an embodiment of the invention, a design structure is provided that is readable by a machine used in design, manufacture, or simulation of an integrated circuit. The design structure includes a drain comprised of a first semiconductor material having a first band gap, a source comprised of a second semiconductor material having a second band gap, and a tunnel barrier between the source and the drain. The second semiconductor material exhibits a broken-gap alignment with the first semiconductor material. The tunnel barrier is comprised of a third semiconductor material with a third band gap larger than the first band gap and larger than the second band gap. The third band gap is configured to bend under an external bias to assist in aligning a first energy band of the first semiconductor material with a second energy band of the second semiconductor material. The design structure may comprise a netlist. The design structure may also reside on a storage medium as a data format used for the exchange of layout data of integrated circuits. The design structure may reside in a programmable gate array.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
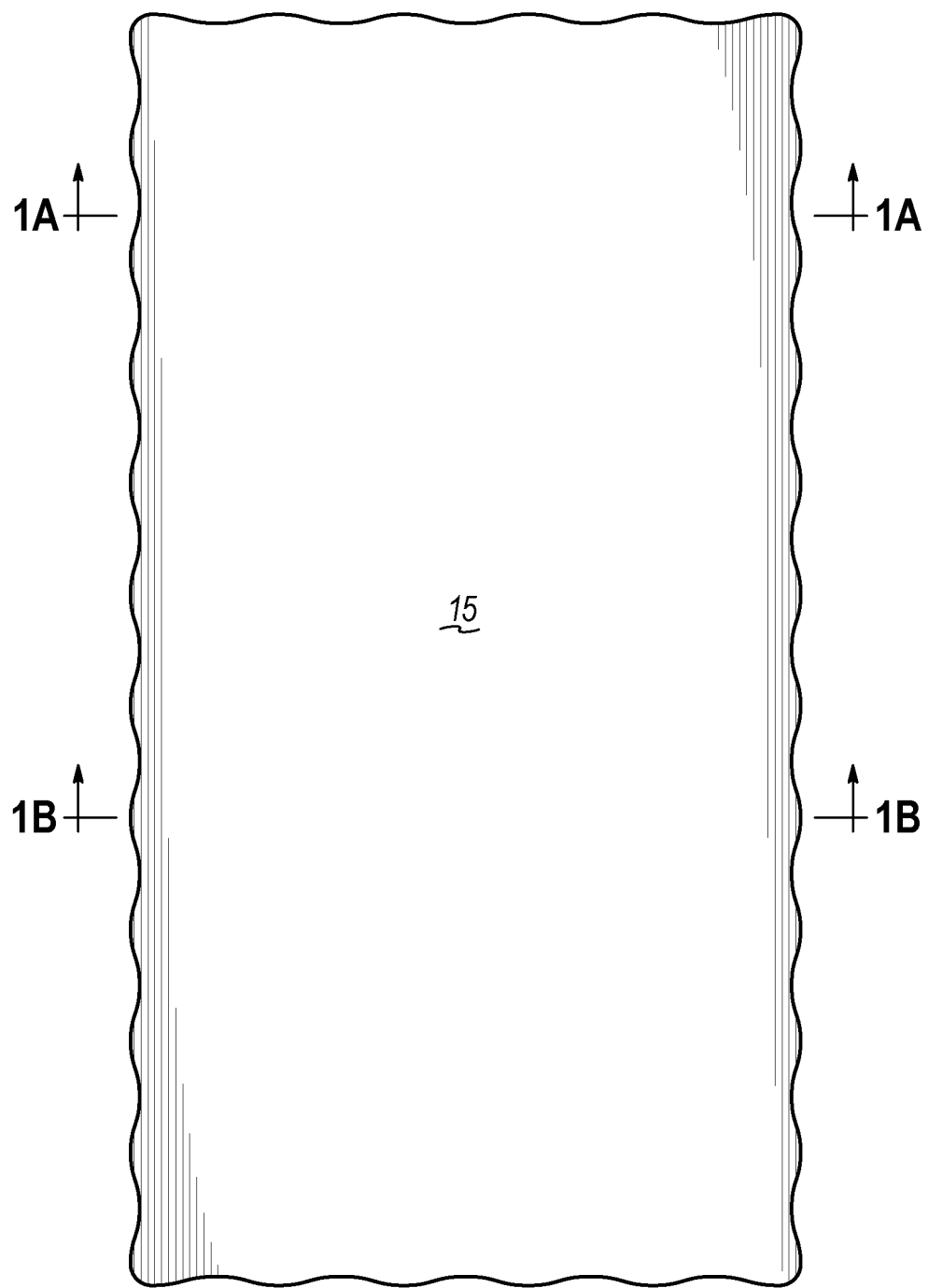
FIG. 1 is a top view of a portion of a substrate at an initial stage of a processing method for fabricating a device structure in accordance with an embodiment of the invention.
Figure 1A:
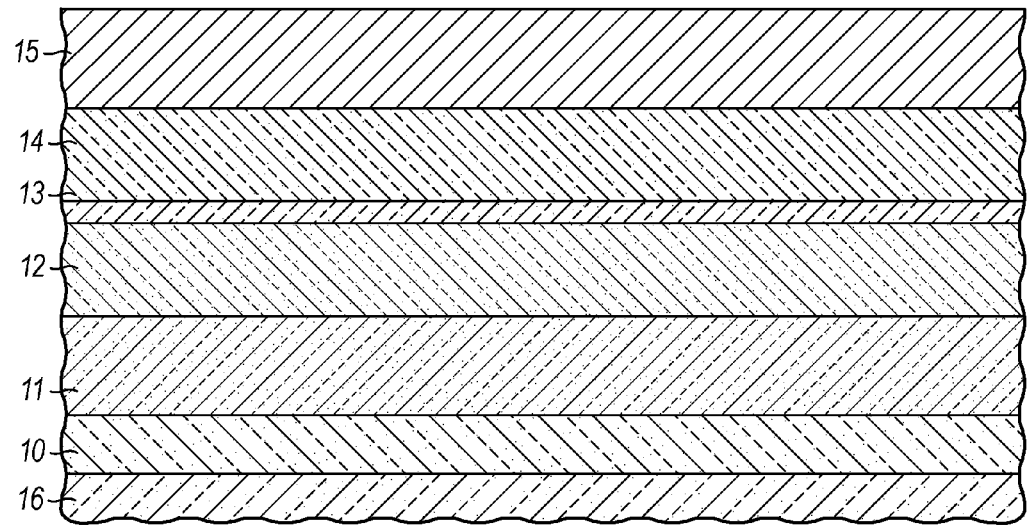
FIG. 1A is a cross-sectional view taken generally along line 1A-1A in FIG. 1.
Figure 1B:
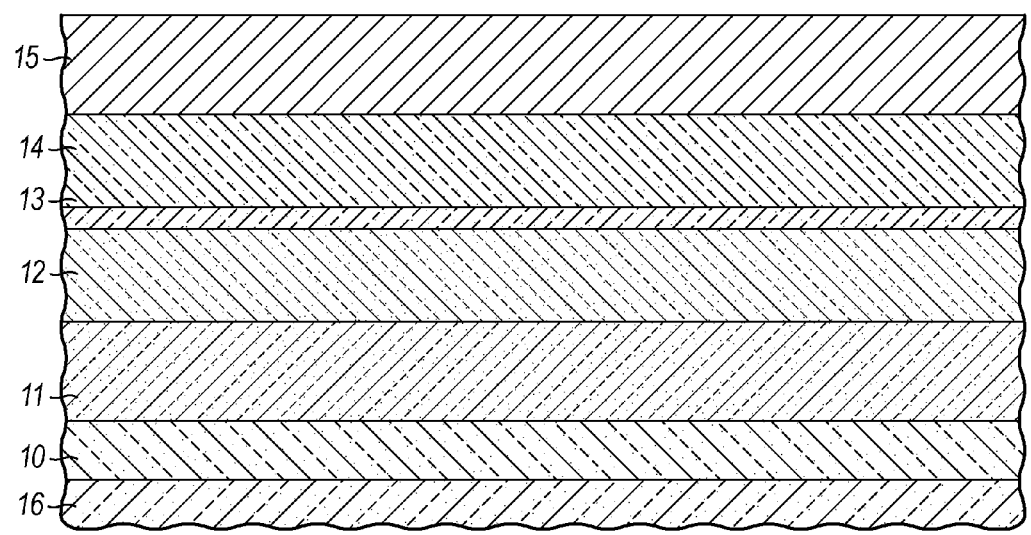
FIG. 1B is a cross-sectional view taken generally along line 1B-1B in FIG. 1.

With reference to FIGS. 1, 1A, 1B and in accordance with an embodiment of the invention, a plurality of layers 10, 11, 12, 13, 14, 15 are deposited on a substrate 16, which may be any suitable bulk, silicon-on-insulator, or silicon-on-sapphire substrate comprising a semiconductor material suitable for forming an integrated circuit and for epitaxial growth of other Group III-Group V (III-V) semiconductor materials. In one embodiment, the substrate 16 may be a carrier wafer comprised of gallium arsenide (GaAs).

The layers 10-14 are serially formed in a layer stack using one or more epitaxial growth techniques, such as molecular beam epitaxy (MBE). Generally, the semiconductor materials for layers 12, 13, 14 may be selected from the group consisting of the 6.1 Å family of semiconductor materials, ternaries of the 6.1 Å family of semiconductor materials, quanternaries of 6.1 Å family of semiconductor materials, or Group II-VI having a lattice constant similar to the 6.1 Å family of semiconductor materials.

Layer 11 may be comprised of a binary III-V semiconductor material, such as gallium antimonide (GaSb), or a ternary III-V semiconductor material, such as aluminum gallium antimonide (AlGaSb). The semiconductor material of layer 11 may be doped to have, for example, p-type conductivity. Layer 10 may be comprised of a binary III-V semiconductor material, such as indium arsenide (InAs), and may be doped to have the same n-type conductivity. Layer 10 may constitute a growth buffer layer between the substrate 16 and layer 11. In certain embodiments, layer 12 may be comprised of a ternary III-V semiconductor material, such as gallium antimonide ($Al_xGa_{1-x}Sb$), and may be intrinsic or undoped when formed. Layer 10 and layer 11 may be heavily doped to reduce the respective resistivities. Layer 10 may operate as the source contact and layers 11, 12 may operate as a multilayer source in the completed device structure.

Layers 14 and 15 may respectively operate as a drain and a drain contact in the device construction. In certain embodiments, drain layer 14 may be comprised of a binary III-V semiconductor material, such as indium arsenide (InAs) or a ternary III-V semiconductor material, such as indium arsenide antimonide (InAsSb). Drain layer 14 may be doped to have n-type conductivity or, alternatively, may be intrinsic. A portion of drain layer 14 may be unintentionally doped by one or more impurities introduced during growth. The drain contact layer 15 may be comprised of a conductor, such as a metal. Alternatively, drain contact layer 15 may be comprised of the same material as drain layer 14 that also has n-type conductivity and is more heavily doped than drain layer 14. The semiconductor material of source layer 12 (i.e., the source of the device structure) exhibits a broken-gap energy band alignment with the semiconductor material of drain layer 14 (i.e., the drain of the device structure). Source layer 12 and drain layer 14 may operate in the device construction to provide interband alignment control for the tunneling window, threshold voltage control, and source band control.

Layer 13 may operate in the device construction as a tunnel barrier and may supply interband alignment control for the tunneling window. In certain embodiments, the tunnel barrier layer 13 may be comprised of a binary III-V semiconductor material, such as aluminum antimonide (AlSb) or a binary II-VI semiconductor material, such as zinc telluride (ZnTe), or a ternary or a quaternary of Group II, III, V, VI materials. Tunnel barrier layer 13 may also be intrinsic when formed. In alternative embodiments, layers 12 and 13 may be comprised of another binary or ternary III-V semiconductor material, a binary or ternary Group II-Group VI (II-VI) semiconductor material, or a Group IV semiconductor material with suitable characteristics. The semiconducting material comprising tunnel barrier layer 13 have a band gap larger than the band gap of the semiconducting material comprising layers 12 and 14. The band gap of tunnel barrier layer 13, which is relatively large in comparison to the band gap of layers 12 and 14, may block thermal current from both the source and drain of the device structure under working conditions in which thermal currents are not desirable.

The energy bands of the semiconductor materials comprising layers 12, 13, 14 may bend under external bias from a gate electrode to cause alignment of the energy bands of the semiconductor materials of layers 12 and 14 (i.e., type III band alignment). In particular, the bending of the energy bands of the semiconductor material comprising tunnel barrier layer 13 (i.e., the tunnel barrier) may assist in aligning the valence band of the semiconductor material comprising source layer 12 with the conduction band of the semiconductor material comprising drain layer 14. This selective alignment opens and closes a tunneling energy window between the source and drain. Broken-gap heterojunctions characterized by Type III band alignment differ from straddling gap heterojunctions with Type I band alignment and from staggered gap heterojunctions with Type II band alignment. Straddling gap heterojunctions allow electron and hole confinement on the same side of the heterojunction, and staggered gap heterojunctions allow electron and hole confinement on two sides of the heterojunction, respectively. In contrast, due to mixing of electron and hole states at the broken gap energy window, carrier confinement for broken-gap heterojunctions varies dependent on the strength of an applied external electric field. In a type III heterojunction, the valence band edge of one material or materials (e.g., source layers 11, 12) is located above the conduction band edge of the other material or materials (e.g., drain layer 14).

In the representative embodiment, the respective semiconductor materials of layers 11-14 belong to the 6.1 Å family of semiconductor materials (InAs/AlSb/GaSb), as well as their ternaries and quaternaries. InAs and GaSb of the 6.1 Å semiconductor material family have a direct band gap with broken-gap (Type III) alignment that may be well suited for tunneling applications. The band gap of GaSb is around 0.73 eV. InAs is characterized by a relatively small band gap (0.36 eV). AlSb is characterized by a relatively-large indirect band bap ($E_g^X$=1.7 eV, $E_g^\Gamma$=2.4 eV), which satisfies the requirement that the semiconductor material of tunnel barrier layer 13 have a larger band gap than the semiconductor materials of layers 12 and 14.

A wide range of band alignments and band gaps can be provided using the 6.1 Å semiconductor material family by tuning the material composition. The semiconductor materials of the 6.1 Å family are characterized by a minimal lattice mismatch, which may promote lattice matching over a wide range of alloy compositions. In particular, GaSb and AlSb are nearly lattice-matched to each other and to InAs. The lattice matching may be beneficial in promoting epitaxial growth of a layer stack with reduced defect generation.

Figure 2:
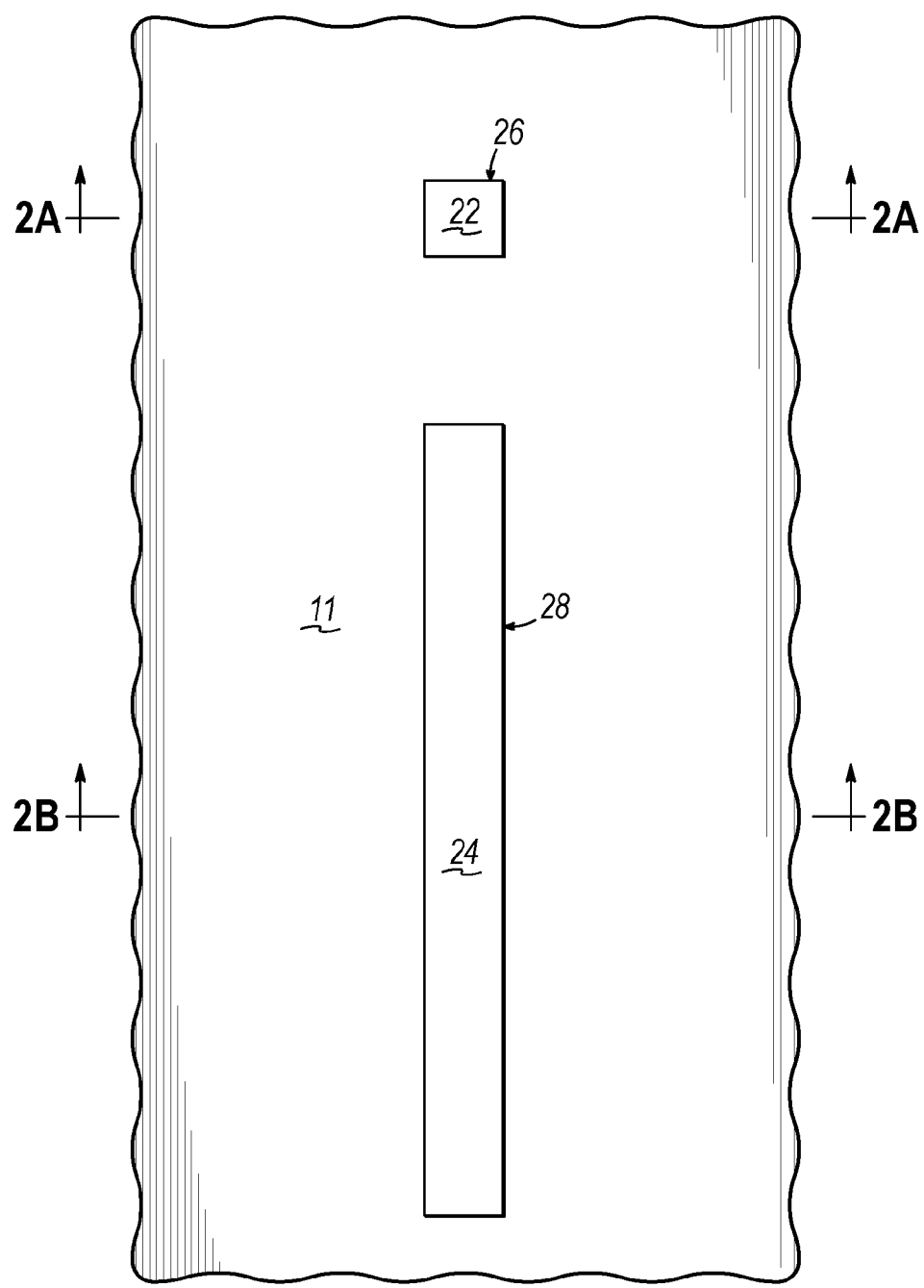
FIGS. 2, 2A, and 2B are top and cross-sectional views respectively similar to FIGS. 1, 1A, and 1B at a subsequent stage of the processing method.
Figure 2A:
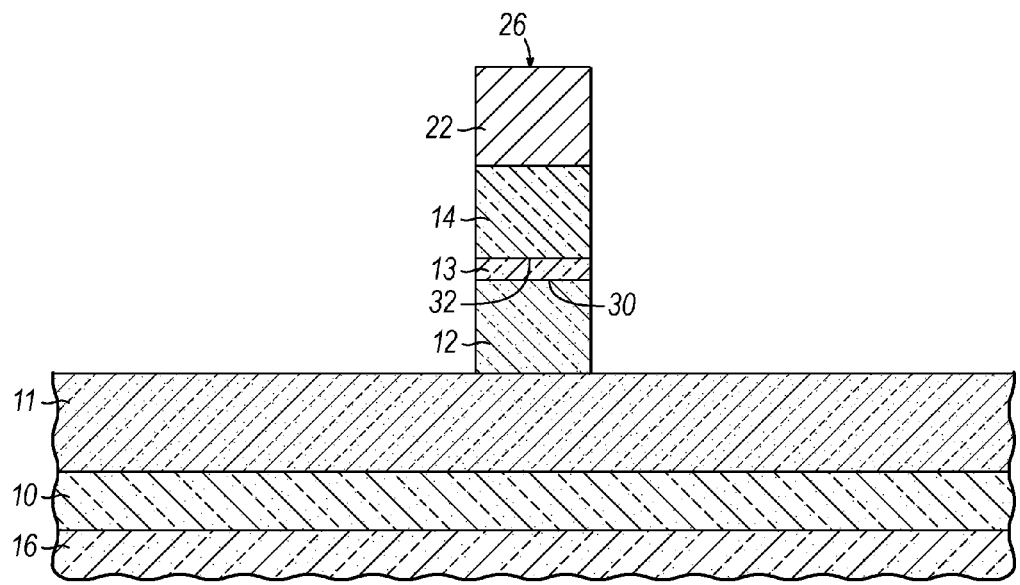
Figure 2B:
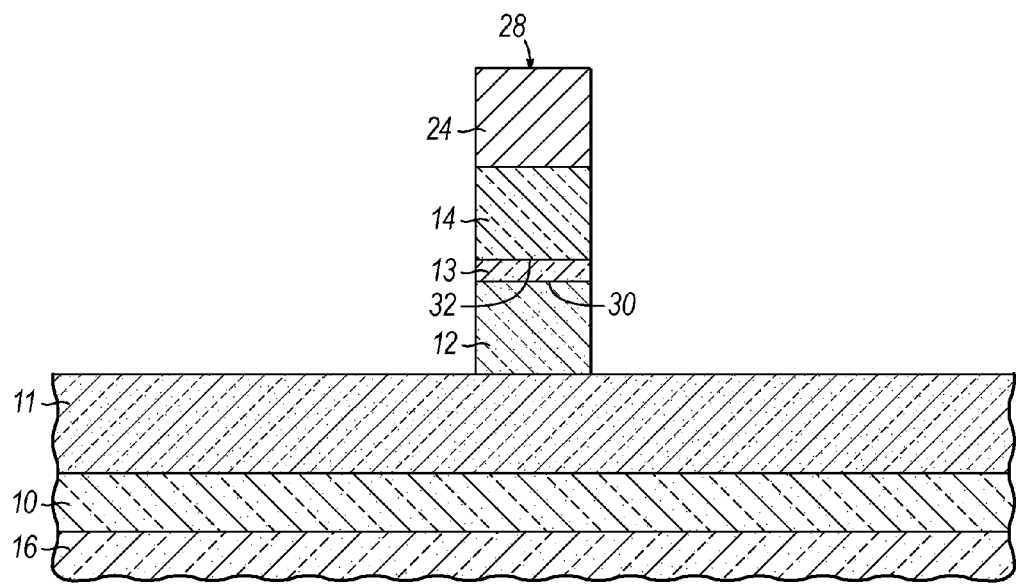

With reference to FIGS. 2, 2A, 2B in which like reference numerals refer to like features in FIGS. 1, 1A, 1B and at a subsequent fabrication stage of the processing method, drain contacts 22, 24 are formed from layer 15. To that end, a mask layer may applied to drain contact layer 15 and photolithographically patterned. The mask layer may be a resist layer comprised of a radiation-sensitive organic material applied by spin coating, pre-baked, exposed to radiation to impart a latent image of a pattern, baked, and then developed with a chemical developer to leave resist at the intended locations for the contacts 22, 24. An etching process may be used to etch layer 15 selective to the material of drain layer 14 to define contacts 22, 24 consistent with the pattern embodied in the mask layer. After the drain contacts 22, 24 are formed, the mask layer may be removed by, for example, oxygen plasma ashing or wet chemical stripping and a conventional cleaning process may be applied to remove any contaminants.

One or more additional etch processes may be used to pattern layers 12-14 to simultaneously define bodies 26, 28 that include tunnel junctions 30, 32. The drain contacts 22, 24 may furnish an etch mask so that the bodies 26, 28 are self-aligned with drain contacts 22, 24, and so that the etched layers 12-14 of each of the bodies 26, 28 are self-aligned with each other in a vertical arrangement. The etching process used to etch layer 12 may remove source layer 12 selective to source layer 11 so that source layer 11 operates as an etch stop. In one embodiment, the bodies 26, 28 may be formed using a sidewall image transfer (SIT) process and/or an atomic layer etching process or a low damage plasma etching process.

In the representative embodiment, the body 26 is shorter in length than the body 28. However, the lengths of the bodies 26, 28 may be selected as a design parameter. In the representative embodiment, the widths of the bodies 26, 28 are equal. However, the widths of the bodies 26, 28 may also be selected as a design parameter and can be unequal. In one embodiment, the width of the bodies 26, 28 may be on the order of 10 nm or narrower. Such narrow fin widths for the bodies 26, 28 may eliminate leakage paths.

Figure 3:
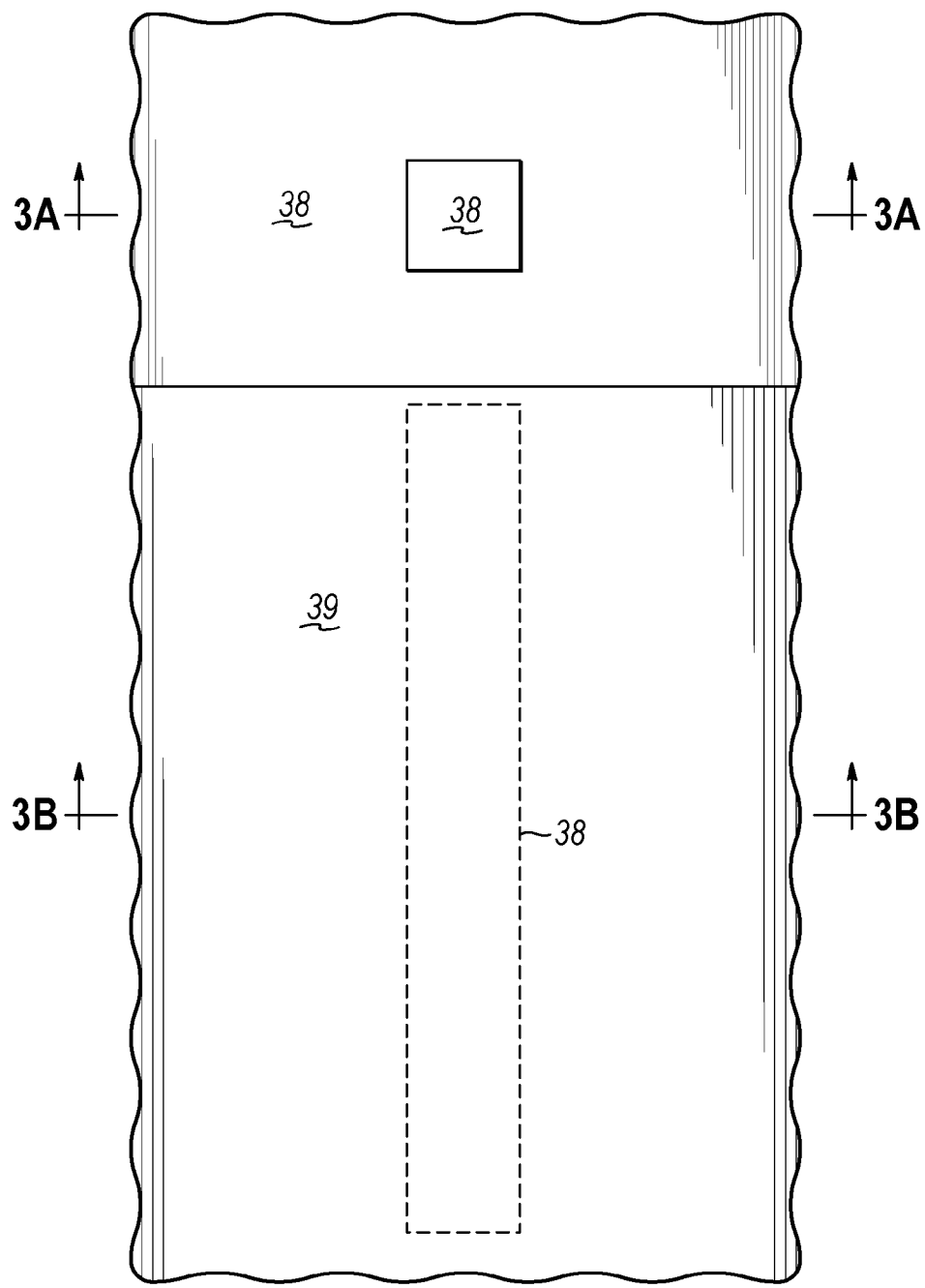
FIGS. 3, 3A, and 3B are top and cross-sectional views respectively similar to FIGS. 2, 2A, and 2B at a subsequent stage of the processing method.
Figure 3A:
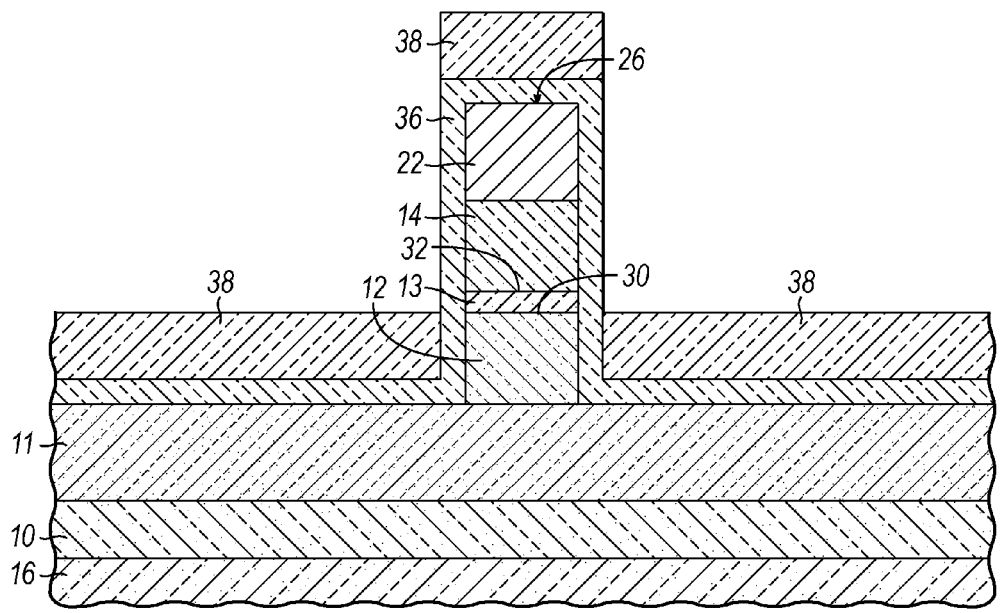
Figure 3B:
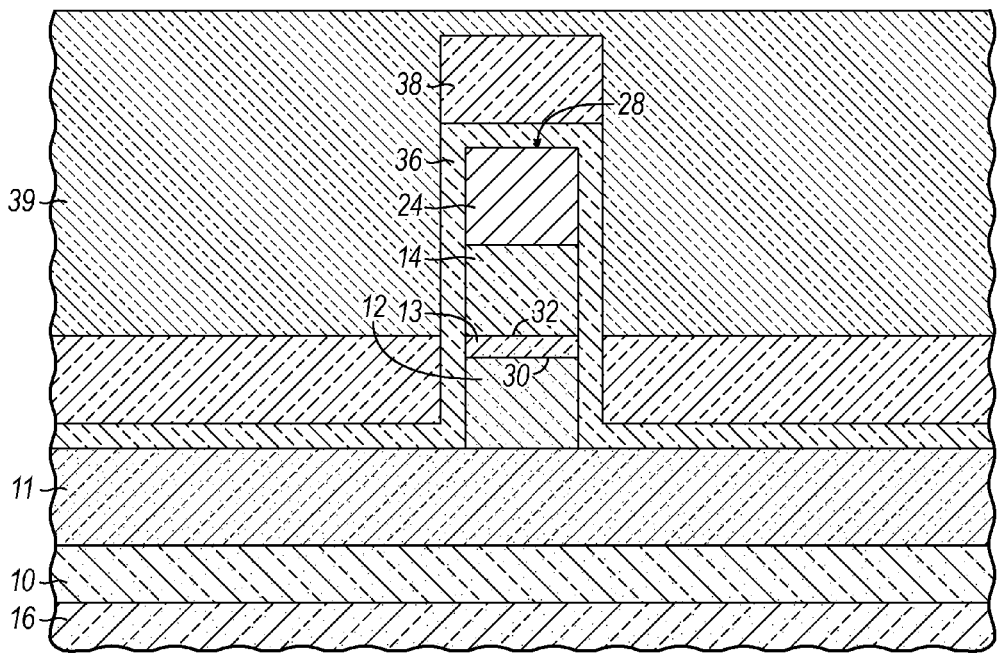

With reference to FIGS. 3, 3A, 3B in which like reference numerals refer to like features in FIGS. 2, 2A, 2B and at a subsequent fabrication stage of the processing method, a gate dielectric layer 36 is formed that covers the sidewalls of bodies 26, 28 as L-shaped spacers. The gate dielectric layer 36 may be formed by depositing a conformal layer comprised of an electrical insulator, such as a high-k dielectric deposited by atomic layer deposition (ALD). The conformal layer may be optionally processed with an anisotropic etching process, such as reactive ion etching (RIE), to preferentially remove the constituent electrical insulator from horizontal surfaces. The dielectric material comprising gate dielectric layer 36 may be a hafnium-based high-k dielectric material such as hafnium dioxide ($HfO_2$) or hafnium silicate ($HfSiO_4$), aluminum oxide ($Al_2O_3$), or a layered stack of these and other similar materials.

A dielectric layer 38 comprised of an organic or inorganic dielectric material that is an electrical insulator with an electrical resistivity at room temperature of greater than $10^{10}$ ($\Omega$-m) is deposited. Dielectric layer 38 may be comprised of a low-k dielectric material characterized by a relative permittivity or dielectric constant smaller than the $SiO_2$ dielectric constant of approximately 3.9. Candidate low-k dielectric materials for dielectric layer 38 include, but are not limited to, porous and nonporous spun-on organic low-k dielectrics (e.g., thermoset polymer resins), porous and nonporous inorganic low-k dielectrics (e.g., organosilicate glasses, hydrogen-enriched silicon oxycarbide (SiCOH), and carbon-doped oxides), and combinations of these and other organic and inorganic dielectrics. Dielectric layer 38 may be deposited by any number of techniques including, but not limited to, sputtering, spin-on application, or CVD.

A mask layer 39 is applied to dielectric layer 38. The mask layer 39 may be a resist layer comprised of a radiation-sensitive organic material applied by spin coating, pre-baked, exposed to radiation to impart a latent image of a resist pattern, baked, and then developed with a chemical developer. The mask layer 39 masks the body 28 and the portions of dielectric layer 38 local to and surrounding body 28. However, body 26 and the portions of dielectric layer 38 local to and surrounding body 26 are not masked.

Figure 4:
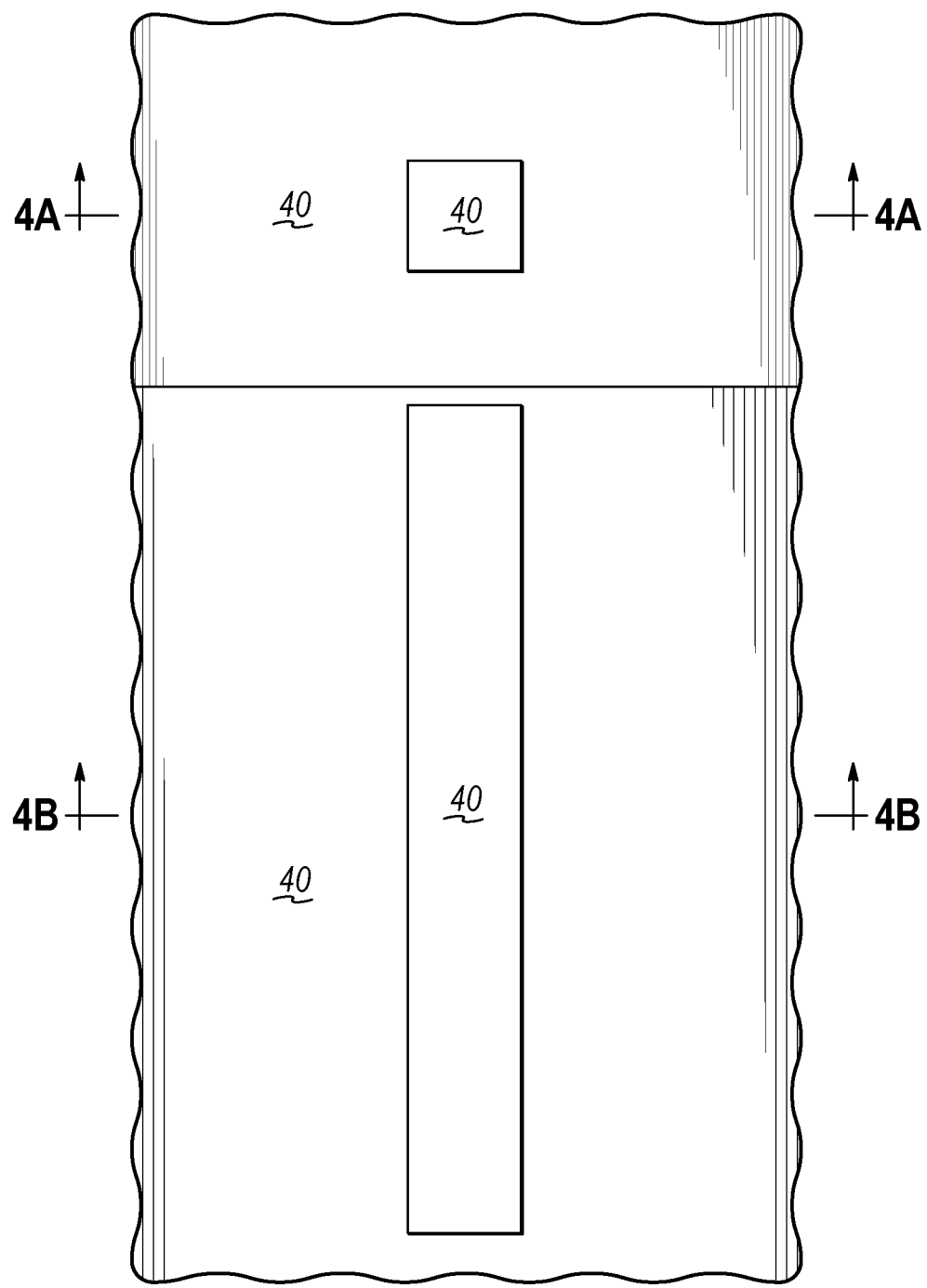
FIGS. 4, 4A, and 4B are top and cross-sectional views respectively similar to FIGS. 3, 3A, and 3B at a subsequent stage of the processing method.
Figure 4A:
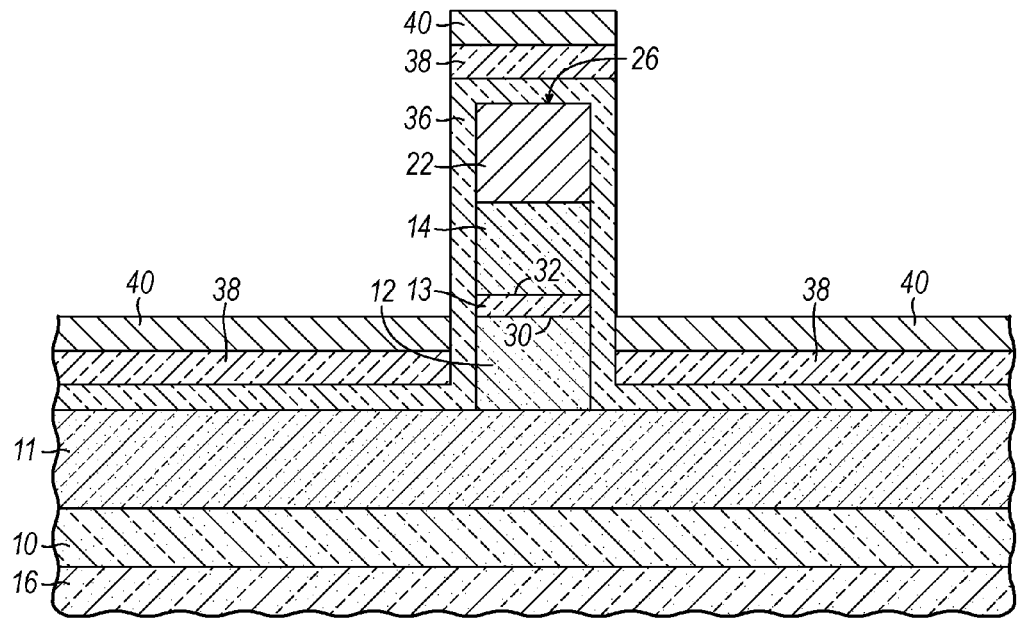
Figure 4B:
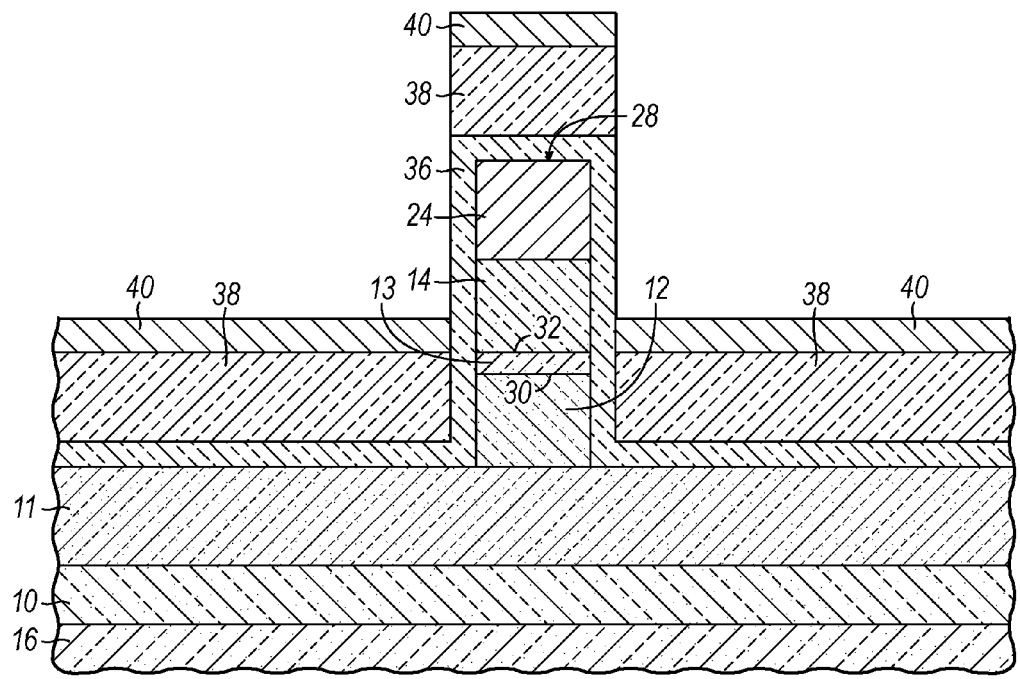

With reference to FIGS. 4, 4A, 4B in which like reference numerals refer to like features in FIGS. 3, 3A, 3B and at a subsequent fabrication stage of the processing method, the dielectric layer 38 may be treated with an anisotropic etching process, such as RIE, to reduce the thickness of the dielectric layer 38 adjacent to body 26. The mask layer 39 may be removed by, for example, oxygen plasma ashing or wet chemical stripping and a conventional cleaning process may be applied to remove any contaminants. The region of dielectric layer 38 adjacent to body 28 is thicker than the region of dielectric layer 38 adjacent to body 26. As a result, the region of dielectric layer 38 adjacent to body 28 and region of dielectric layer 38 adjacent to body 26 are at different heights relative to layers 12-14.

A conductor layer 40 is applied to the dielectric layer 38. Candidate conductive materials for the conductor layer 40 may comprise, for example, a metal, a metal silicide, polycrystalline silicon (polysilicon), or a combination of these and other materials, deposited by a CVD process, etc.

Figure 5:
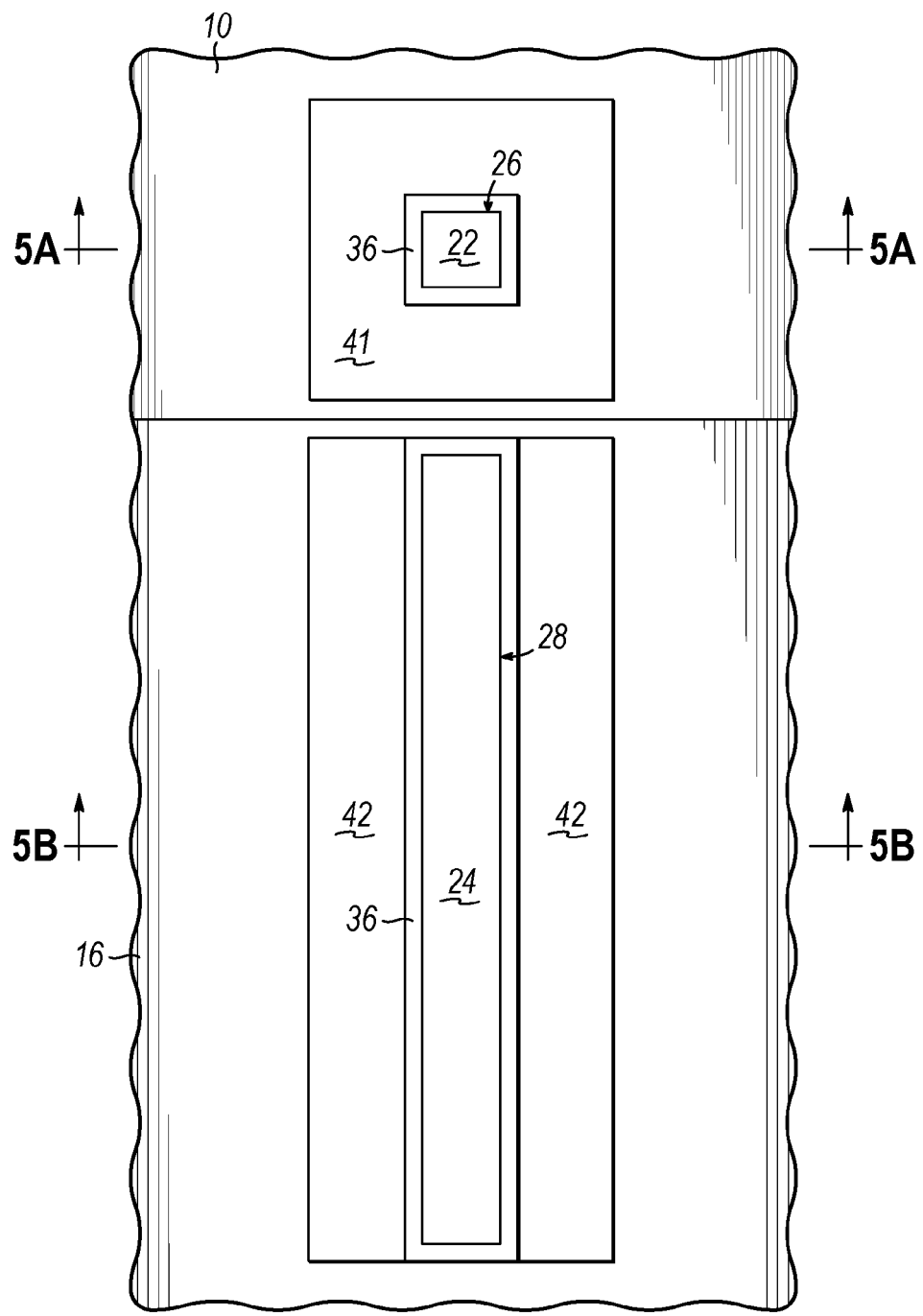
FIGS. 5, 5A, and 5B are top and cross-sectional views respectively similar to FIGS. 4, 4A, and 4B at a subsequent stage of the processing method.
Figure 5A:
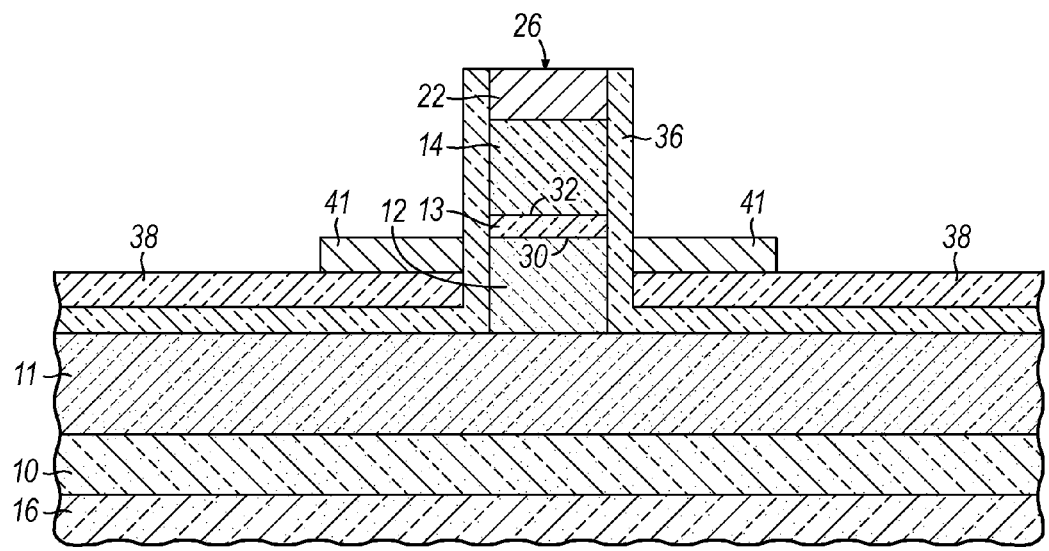
Figure 5B:
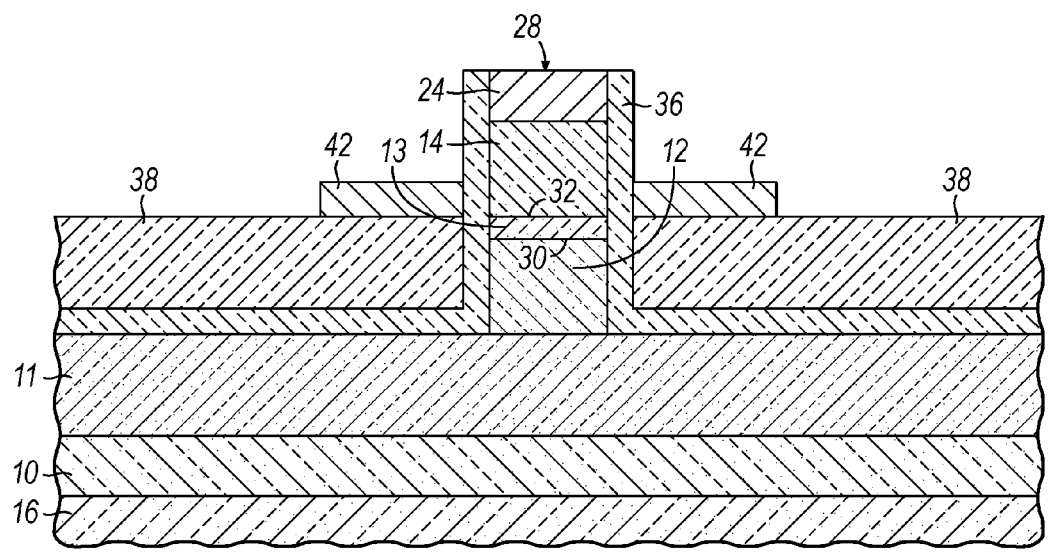

With reference to FIGS. 5, 5A, 5B in which like reference numerals refer to like features in FIGS. 4, 4A, 4B and at a subsequent fabrication stage of the processing method, the conductor layer 40 is patterned to simultaneously define discrete gate electrodes 41, 42. To that end, a mask layer may be applied to the conductor layer 40. The mask layer may be a resist layer comprised of a radiation-sensitive organic material applied by spin coating, pre-baked, exposed to radiation to impart a latent image of a resist pattern, baked, and then developed with a chemical developer. Gate electrode 41 is associated with body 26 and, in the representative embodiment, gate electrode 41 surrounds body 26 in a gate-all-around (GAA) device configuration. Gate electrode 42 is associated with body 28 and, in the representative embodiment, gate electrode 42 includes strips that flank the body 28 in a dual gate or multiple-gate device configuration. The multiple gates of gate electrode 42 may be jointly controlled to act electrically as a single gate or may be individually controlled to operate as independent gate electrodes. In alternative embodiments, gate electrode 41 may have the multiple-gate device configuration, gate electrode 42 may have the GAA device configuration, the gate electrodes 41, 42 may both have the GAA, or the gate electrodes 41, 42 may both have the multiple gate device configuration. Excess material from drain contact layer 15 and other field materials may be removed by polishing (e.g., a chemical mechanical polish (CMP)). The gate electrodes 41, 42 are self-aligned with the bodies 26, 28 during their formation, and are electrically isolated from each other.

Figure 6:
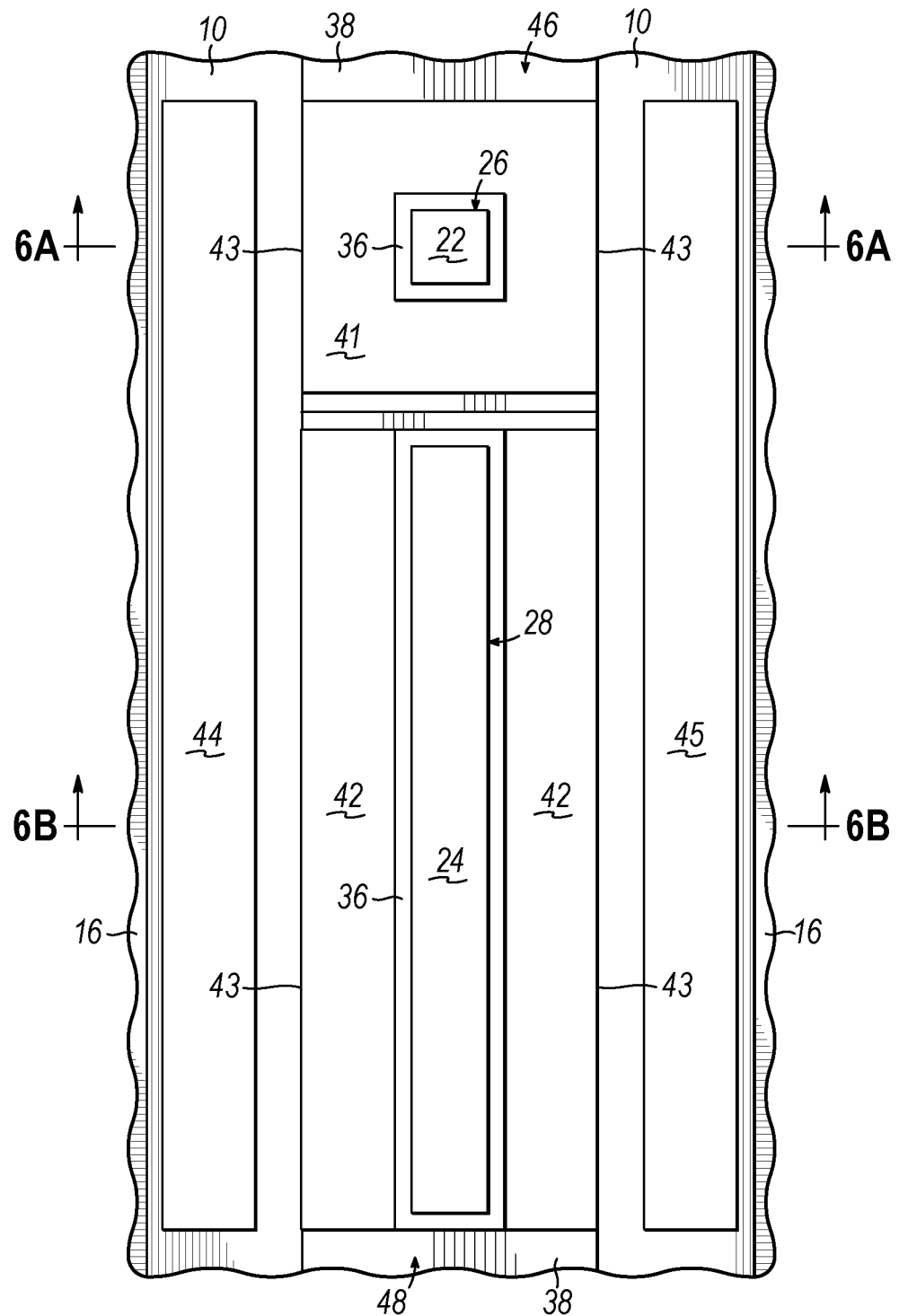
FIGS. 6, 6A, and 6B are top and cross-sectional views respectively similar to FIGS. 5, 5A, and 5B at a subsequent stage of the processing method.
Figure 6A:
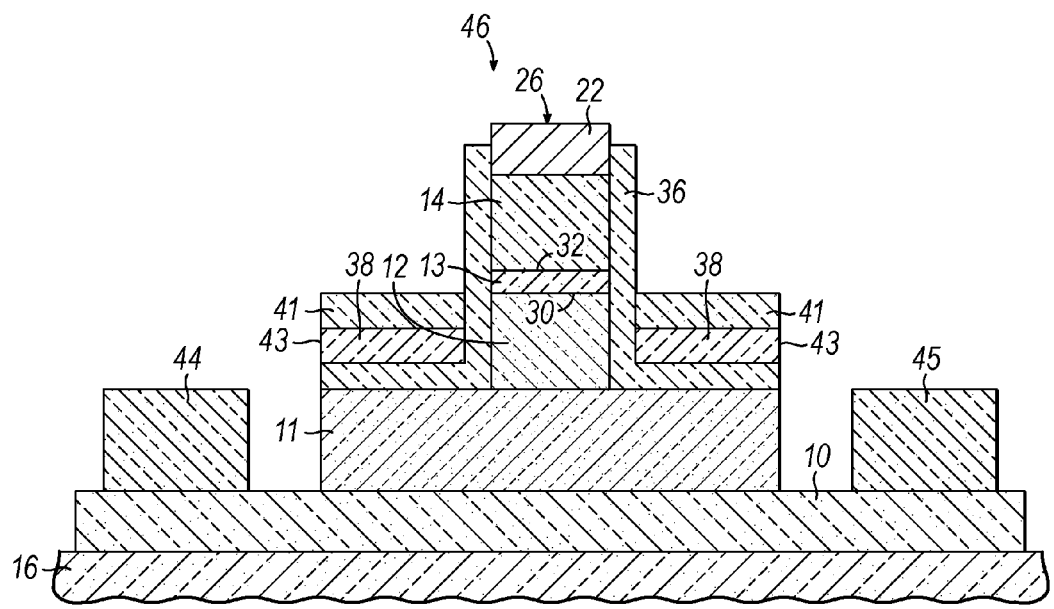
Figure 6B:
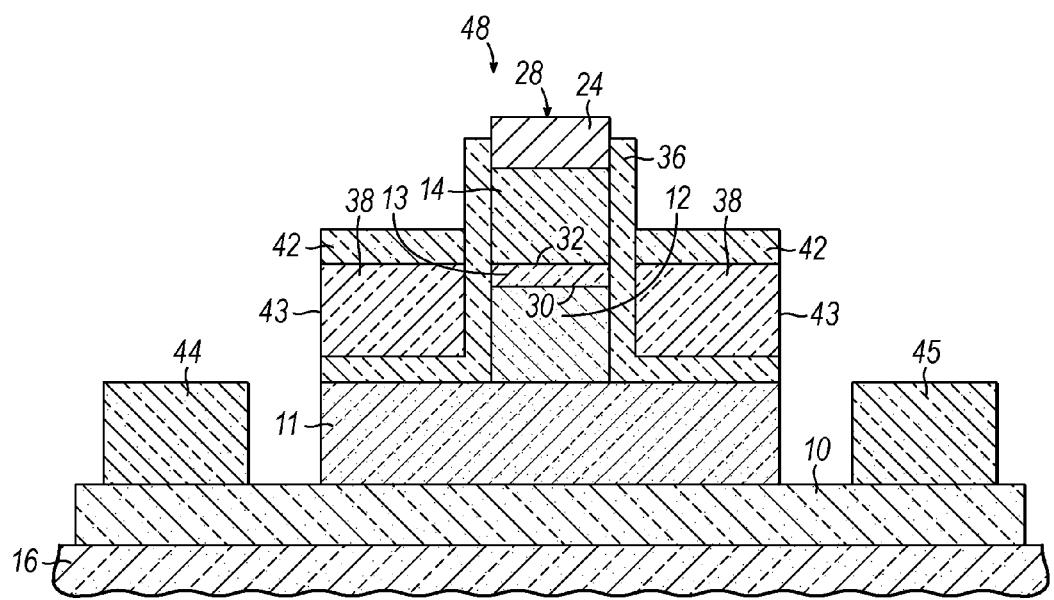

With reference to FIGS. 6, 6A, 6B in which like reference numerals refer to like features in FIGS. 5, 5A, 5B and at a subsequent fabrication stage of the processing method, layers 11, 36, 38 are patterned to define a perimeter at an outer boundary 43. The gate electrodes 41, 42 may be used as an etch mask and one or more etching processes, such as RIE processes, may be used to pattern the layers 11, 36, 38. The etching process for source layer 11 may be selective to the material of layer 10 so that layer 10 operates as an etch stop.

Source contacts 44, 45 to layer 10, which furnishes a source contact, are formed outside the outer boundary 43. The source contacts 44, 45 may be formed by depositing a layer of a conductive material (e.g., a metal), masking the layer, and etching the layer with an etching process, such as a RIE process. Electrical isolation is provided by removing field regions of layer 10.

The resulting device structure comprises a complementary set of tunnel field-effect transistors 46, 48 that are fabricated from a single layer stack comprising layers 10-15 and that have a vertical structural arrangement. The tunnel field-effect transistors 46, 48 share layer 11 as a common source and are fabricated without the need for regrowth. In the representative embodiment, the tunnel field-effect transistor 46 is a p-type device and the tunnel field-effect transistor 48 is an n-type device. The device structure may be fabricated by adopting and adapting existing CMOS circuit designs, and is readily scalable to meet power and/or current requirements.

The tunnel field-effect transistor 46 includes the body 26, the gate electrode 41, and an intervening section of gate dielectric layer 36 between the body 26 and gate electrode 41. The gate electrode 41 is vertically positioned in a plane below a plane containing tunnel barrier layer 13 and adjacent a plane containing source layer 12. The thickness of the dielectric layer 38, when formed by deposition and etched as discussed above, is selected to align the gate electrode 41 relative to the tunnel barrier layer 13.

The plane in which gate electrode 41 is positioned is on the source side of the plane containing tunnel barrier layer 13. The semiconductor material of tunnel barrier layer 13 may experience "band swinging" in tunnel field-effect transistor 46 by bending of its energy bands (i.e., valence and conduction bands) under an electrostatic field (i.e., an external bias) applied from the gate electrode 41. Generally, the band gap of a semiconductor material refers to the energy difference (in electron volts) between the top of the valence band and the bottom of the conduction band.

The tunnel field-effect transistor 48 comprises the body 28, the gate electrode 42, and an intervening section of gate dielectric layer 36 between body 28 and gate electrode 42. The gate electrode 42 is vertically positioned in a plane above a plane containing tunnel barrier layer 13 and adjacent to a plane containing drain layer 14. The thickness of the dielectric layer 38, when formed by deposition and masked during etching as discussed above, is selected to align the gate electrode 42 relative to the tunnel barrier. The plane in which gate electrode 42 is positioned is on the drain side of the plane containing tunnel barrier layer 13. Hence, gate electrode 42 is positioned on an opposite side of the plane containing tunnel barrier layer 13 from gate electrode 41 due to the greater thickness of the dielectric layer 38. The semiconductor material of tunnel barrier layer 13 may experience "band swinging" in tunnel field-effect transistor 48 due to bending of its valence and conduction bands under an electrostatic field applied from the gate electrode 42.

The energy band bending may selectively open and close respective tunneling energy windows, which switches the tunneling current on and off in tunnel field-effect transistor 46 and in tunnel field-effect transistor 48. The localization of the gate electrodes 41, 42 relative to tunnel barrier layer 13 may provide improved electrostatic control over the tunnel junction energy alignment.

During the front-end-of-line (FEOL) portion of the fabrication process, the device structure comprising the tunnel field-effect transistors 46, 48 may be replicated across at least a portion of the surface area of the substrate 16. Standard silicidation and standard middle-end-of-line (MEOL) and back-end-of-line (BEOL) processing follows, which includes formation of contacts and wiring for the local interconnect structure overlying the tunnel field-effect transistors 46, 48, and formation of dielectric layers, via plugs, and wiring for an interconnect structure coupled by the interconnect wiring with the tunnel field-effect transistors 46, 48.

Figure 7A:
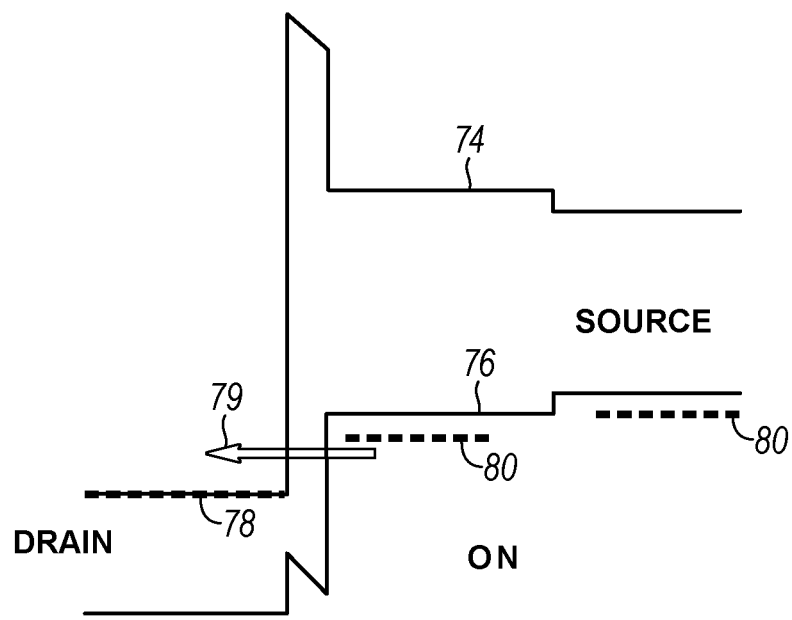
FIGS. 7A and 7B are band diagrams respectively illustrating the bending of the energy bands of a p-type tunnel field effect transistor when the tunneling window is opened in response to an applied external bias and the tunneling window is closed in the absence of the applied external bias.
Figure 7B:
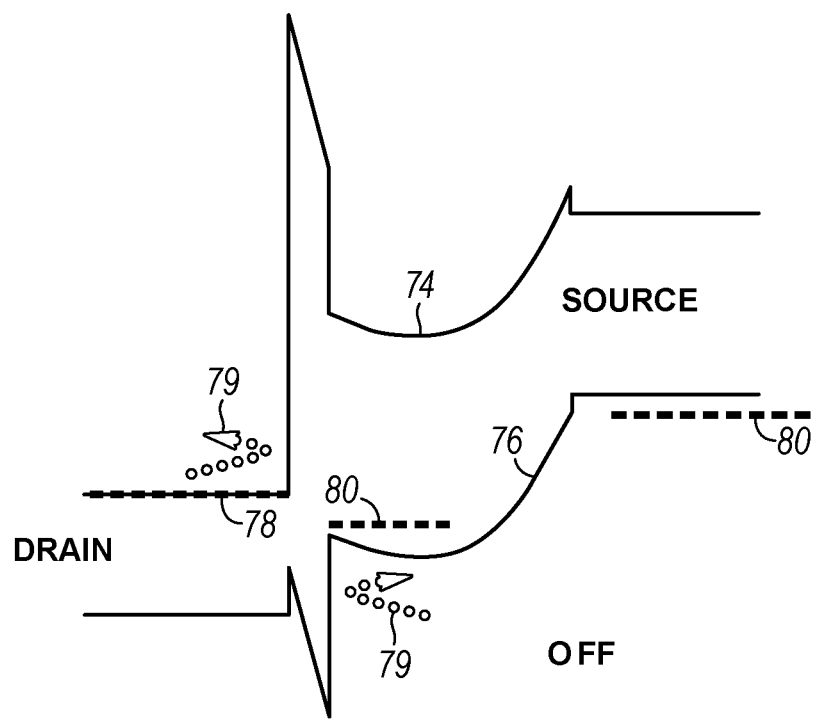

With reference to FIGS. 7A, 7B, the operation of the p-type tunnel field-effect transistor 46 may be illustrated with a band diagram plotting electron energy levels (e.g., Fermi levels and nearby energy band edges) as a function of a position in space (i.e., location) within the layer stack of tunnel field-effect transistor 46. Specifically, the conduction band edge 74 as a function of position over the layers 11-14, the valence band edge 76 as a function of position over the layers 11-14, at least one Fermi level 78 of the drain layer 14, and at least one Fermi level 80 of the source layers 11, 12 are visible in the band diagram. In the band diagram, the conduction band edge is highest across the thickness of the tunnel barrier layer 13, which also exhibits the largest band gap between the band edges 74, 76.

During operation, the drain of the p-type tunnel field-effect transistor 46 is grounded and a small negative voltage is applied to the source of the p-type tunnel field-effect transistor 46. When an external bias is applied to the gate electrode 41 of the p-type tunnel field-effect transistor 46 that is less than a threshold voltage (FIG. 7A), the energy bands 74, 76 of the semiconductor materials comprising the tunnel barrier layer 13, source layers 11, 12, and drain layer 14 of the p-type tunnel field effect transistor 46 bend when the tunneling window is opened by the application of the external bias. The at least one Fermi level 80 of the source layers 11, 12 is higher in the band diagram than the at least one Fermi level 78 of the drain layer 14. Electrons can flow as a tunneling current from the source across the tunnel barrier to the drain as diagrammatically illustrated with the single-headed arrow 79. If the applied external bias is greater than the threshold voltage (FIG. 7B), the tunneling window is closed and the electron flow 79 is blocked. In a condition in which the tunneling window is closed, the at least one Fermi level 80 of the source layers 11, 12 is at a lower energy level in the band diagram than the at least one Fermi level 78 of the drain layer 14.

Figure 8A:
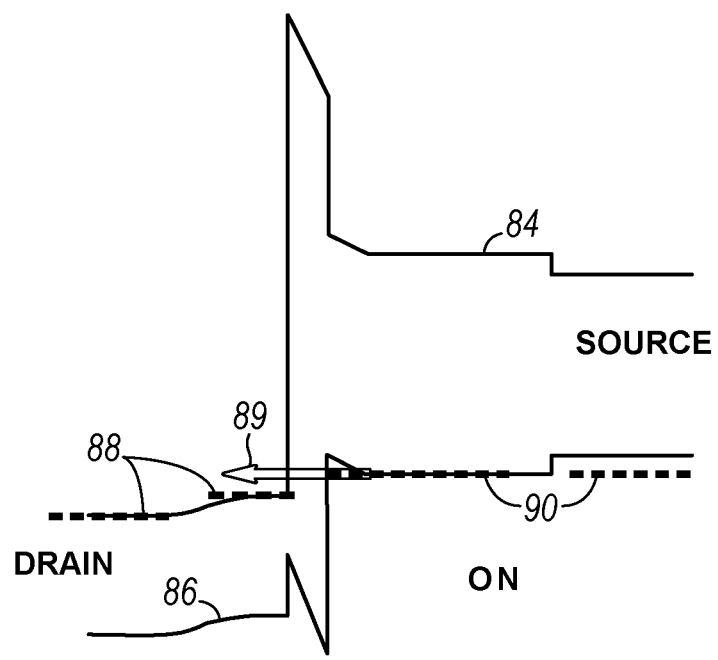
FIGS. 8A and 8B are band diagrams respectively illustrating the energy band bending of the energy bands of an n-type tunnel field effect transistor when the tunneling window is opened in response to an applied external bias and the tunneling window is closed in the absence of the applied external bias.
Figure 8B:
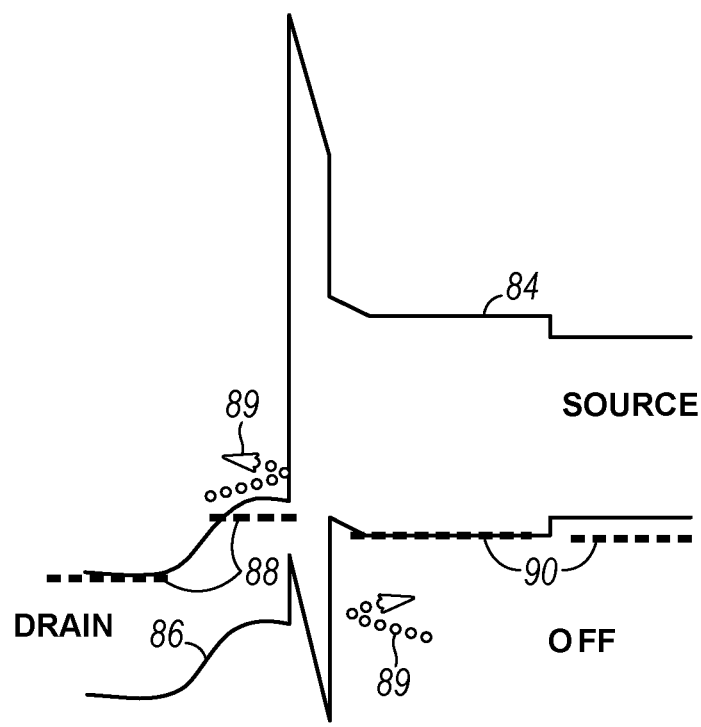

With reference to FIGS. 8A, 8B, the operation of the n-type tunnel field-effect transistor 48 is illustrated with a band diagram plotting electron energy levels (e.g., Fermi levels and nearby energy band edges) as a function of a position in space (i.e., location) within the layer stack of tunnel field-effect transistor 48. Specifically, the conduction band edge 84 as a function of position over the layers 11-14, the valence band edge 86 as a function of position over the layers 11-14, at least one Fermi level 88 of the drain layer 14, and at least one Fermi level 90 of the source layers 11, 12 are visible in the band diagram. In the band diagram, the conduction band edge is highest across the thickness of the tunnel barrier layer 13, which also exhibits the largest band gap between the band edges 84, 86.

During operation, the source of the n-type tunnel field-effect transistor 48 is grounded and a small positive voltage is applied to the drain of the n-type tunnel field-effect transistor 48. When an external bias is applied to the gate electrode 43 of the n-type tunnel field-effect transistor 48 that is greater than a threshold voltage (FIG. 8A), the energy bands 84, 86 of the semiconductor materials comprising the tunnel barrier layer 13, source layers 11, 12, and drain layer 14 of the n-type tunnel field effect transistor 48 bend when the tunneling window is opened by the application of the external bias. The at least one Fermi level 88 of the drain layer 14 is lower than the at least one Fermi level 90 of the source layers 11, 12. Electrons can flow as a tunneling current from the source across the tunnel barrier to the drain as diagrammatically illustrated with the single-headed arrow 89. If the applied external bias is less than the threshold voltage (FIG. 8B), the tunneling window is closed and the electron flow 89 is blocked. In the condition in which the tunneling window is closed, the at least one Fermi level 88 of the drain layer 14 is at a higher energy level in the band diagram than the at least one Fermi level 90 of the source layers 11, 12.

Figure 9:
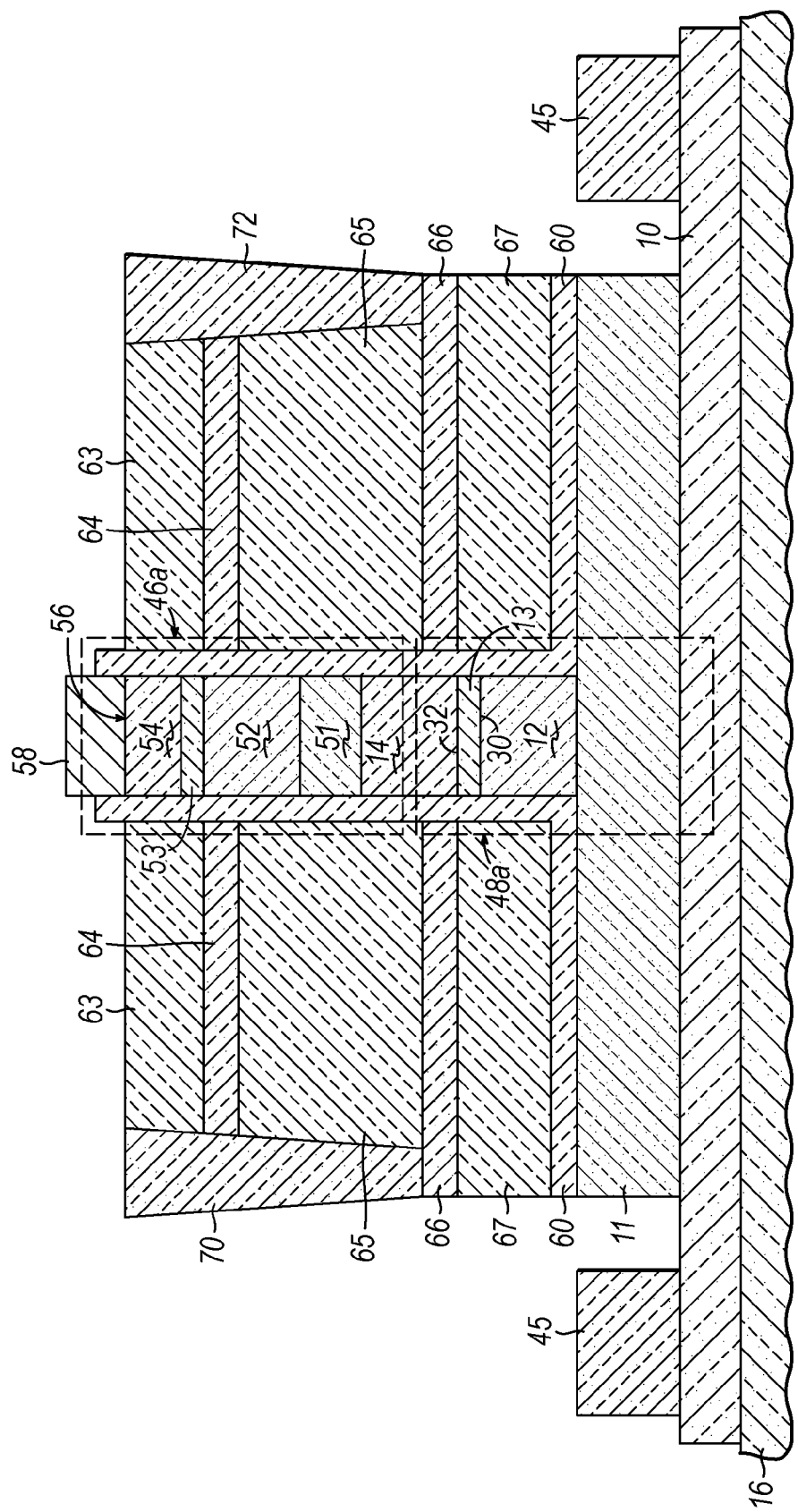
FIG. 9 is a cross-sectional view of a device structure in accordance with an alternative embodiment of the invention.
Figure 10:
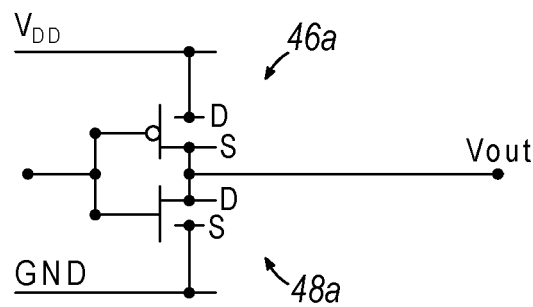
FIG. 10 is a schematic view of the electrical configuration of the device structure of FIG. 9.

With reference to FIGS. 9, 10 in which like reference numerals refer to like features in FIGS. 6, 6A, 6B and in accordance with an alternative embodiment, a device structure may include tunnel field-effect transistors 46a, 48a that are vertically arranged in a stacked structure. Layers 51-54 are added to the layer stack between layers 10-14 and drain contact layer 15. A single body 56 is then formed from layers 12-14, 52-54 by photolithography and etching as discussed above for bodies 26, 28.

Source layer 51 may be comprised of the same material as source layer 11, source layer 52 may be comprised of the same material as source layer 12, tunnel barrier layer 53 may be comprised of the same material as tunnel barrier layer 13, and drain layer 54 may be comprised of the same material as drain layer 14. The layers 12-14 of tunnel field-effect transistor 48a, which may be considered for simplicity of description to be the same layers as found in tunnel field-effect transistor 48, have a vertical arrangement in the body 56. The layers 52-54 of tunnel field-effect transistor 46a also have a vertical arrangement in the body 56 and are stacked relative to the vertical arrangement of layers 12-14. A drain contact 58 to drain layer 54 of tunnel field-effect transistor 46a is formed from drain contact layer 15 in the same manner as drain contacts 22, 24 are formed from drain contact layer 15. Layers 51 and 52 define a multilayer source of tunnel field-effect transistor 46a.

The tunnel field-effect transistors 46a, 48a share a gate dielectric layer 60, which is formed after the body 56 is formed. The gate dielectric layer 60 comprises an L-shape spacer that is similar or identical in construction and composition to gate dielectric layer 36. The gate dielectric layer 60 is extended in height so that the gate dielectric layer 60 covers the sidewalls of the body 56. Dielectric layers 63, 65, 67 each similar to dielectric layer 38 and conductor layers are deposited to form a gate stack arrangement. Photolithography and etching processes are used to pattern the dielectric layers 63, 65, 67 and to pattern the conductor layers to define gate electrodes 64, 66.

In the representative embodiment, tunnel field-effect transistor 46a is a p-type device similar to tunnel field-effect transistor 46 and tunnel field-effect transistor 48a is an n-type device similar to tunnel field-effect transistor 48. The gate electrode 64 of tunnel field-effect transistor 46a is positioned below the tunnel barrier layer 53 and on the source side of tunnel barrier layer 53 adjacent to layer 52. The gate electrode 66 of tunnel field-effect transistor 48a is positioned above the tunnel barrier layer 13 and on the drain side of tunnel barrier layer 13 adjacent to drain layer 14. The tunnel field-effect transistors 46a, 48a operate individually in the same manner as tunnel field-effect transistors 46, 48 as discussed above.

The tunnel field-effect transistors 46a, 48a are constructed and arranged as complementary devices in a single vertical heterostructure, and are wired to define a vertically integrated or stacked inverter structure (FIG. 10). To that end, contacts 70, 72 are formed that extend through the dielectric layers 63, 65, 67 to directly couple the gate electrodes 64, 66, and thereby form wiring needed to define the stacked inverter structure.

The n-type and p-type tunnel field-effect transistors of the various embodiments of the invention may find application in power-efficient, high-speed digital circuits, integrated high-speed microwave circuits, integrated infrared optoelectronics, etc., and may promote increases in integration density for these applications. The n-type and p-type tunnel field-effect transistors may exhibit a low contact resistance and a high mobility, which may be desirable traits for high speed applications. Complementary n-type and p-type tunnel field-effect transistors may be constructed, which constitute a desirable trait for digital applications. In one embodiment, the n-type and p-type tunnel field-effect transistors may be constructed as separate devices each possessing a distinct heterostructure. In another embodiment, the complementary n-type and p-type tunnel field-effect transistors may occupy a single heterostructure. The tunnel field-effect transistors may be characterized by a low threshold voltage ($V_{th}$), may be normally off in a quiescent state, and may only require a low power supply voltage ($V_{dd}$), which may contribute to lowered power consumption.

Figure 11:
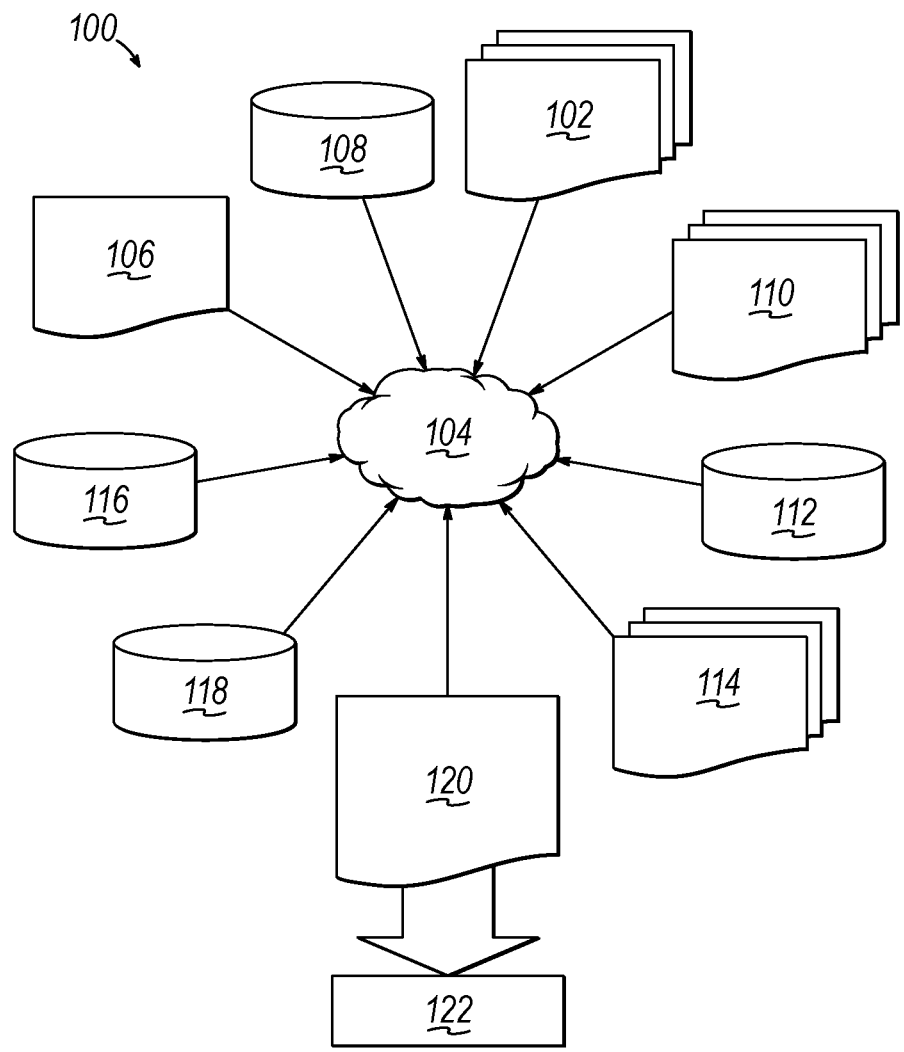
FIG. 11 is a flow diagram of a design process used in semiconductor design, manufacture, and/or test.

FIG. 11 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIGS. 6, 6A, 6B and FIGS. 9, 10. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc.

FIG. 11 illustrates multiple such design structures including an input design structure 102 that is preferably processed by a design process 104. Design structure 102 may be a logical simulation design structure generated and processed by design process 104 to produce a logically equivalent functional representation of a hardware device. Design structure 102 may also or alternatively comprise data and/or program instructions that when processed by design process 104, generate a functional representation of the physical structure of a hardware device. Whether representing functional and/or structural design features, design structure 102 may be generated using electronic computer-aided design (ECAD) such as implemented by a core developer/designer. When encoded on a machine-readable data transmission, gate array, or storage medium, design structure 102 may be accessed and processed by one or more hardware and/or software modules within design process 104 to simulate or otherwise functionally represent an electronic component, circuit, electronic or logic module, apparatus, device, or system such as those shown in FIGS. 6, 6A, 6B and FIGS. 9, 10. As such, design structure 102 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 104 preferably employs and incorporates hardware and/or software modules for synthesizing, translating, or otherwise processing a design/simulation functional equivalent of the components, circuits, devices, or logic structures shown in FIGS. 6, 6A, 6B and FIGS. 9, 10 to generate a netlist 106 which may contain design structures such as design structure 102. Netlist 106 may comprise, for example, compiled or otherwise processed data structures representing a list of wires, discrete components, logic gates, control circuits, I/O devices, models, etc. that describes the connections to other elements and circuits in an integrated circuit design. Netlist 106 may be synthesized using an iterative process in which netlist 106 is resynthesized one or more times depending on design specifications and parameters for the device. As with other design structure types described herein, netlist 106 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 104 may include hardware and software modules for processing a variety of input data structure types including netlist 106. Such data structure types may reside, for example, within library elements 108 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 110, characterization data 112, verification data 114, design rules 116, and test data files 118 which may include input test patterns, output test results, and other testing information. Design process 104 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 104 without deviating from the scope and spirit of the invention. Design process 104 may also include modules for performing standard circuit design processes such as timing analysis, verification, design rule checking, place and route operations, etc.

Design process 104 employs and incorporates logic and physical design tools such as HDL compilers and simulation model build tools to process design structure 102 together with some or all of the depicted supporting data structures along with any additional mechanical design or data (if applicable), to generate a second design structure 120. Design structure 120 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 102, design structure 120 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 6, 6A, 6B and FIGS. 9, 10. In one embodiment, design structure 120 may comprise a compiled, executable HDL simulation model that functionally simulates the devices shown in FIGS. 6, 6A, 6B and FIGS. 9, 10.

Design structure 120 may also employ a data format used for the exchange of layout data of integrated circuits and/or symbolic data format (e.g. information stored in a GDSII (GDS2), GL1, OASIS, map files, or any other suitable format for storing such design data structures). Design structure 120 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 6, 6A, 6B and FIGS. 9, 10. Design structure 120 may then proceed to a stage 122 where, for example, design structure 120: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device structure comprising:
    a first drain comprised of a first semiconductor material having a first band gap;
    a first source comprised of a second semiconductor material having a second band gap and that exhibits a broken-gap energy band alignment with the first semiconductor material; and
    a first tunnel barrier between the first source and the first drain, the first tunnel barrier comprised of a third semiconductor material with a third band gap larger than the first band gap and larger than the second band gap,
    wherein the third band gap is configured to bend under an external bias to assist in aligning a first energy band of the first semiconductor material with a second energy band of the second semiconductor material.

2. The device structure of claim 1 wherein the first semiconductor material, the second the second semiconductor material, and the third semiconductor material selected from the group consisting of the 6.1 Å family of semiconductor materials, ternaries of the 6.1 Å family of semiconductor materials, quanternaries of 6.1 Å family of semiconductor materials, or Group II-VI having a lattice constant similar to the 6.1 Å family of semiconductor materials.

3. The device structure of claim 1 wherein the first source, the first tunnel barrier, and the first drain are vertically arranged as layers in a layer stack defining a body, and further comprising:
    a first dielectric layer on a sidewall of the body;
    a gate electrode adjacent to the sidewall of the body; and
    a second dielectric layer adjacent to the sidewall of the body, the second dielectric layer having a thickness selected to align the gate electrode relative to the first tunnel barrier.

4. The device structure of claim 1 wherein the thickness of the second dielectric layer is selected such that the gate electrode is adjacent to the first source relative to the first tunnel barrier.

5. The device structure of claim 1 wherein the thickness of the second dielectric layer is selected such that the gate electrode is adjacent to the first drain relative to the first tunnel barrier.

6. The device structure of claim 1 wherein the first dielectric layer is comprised of a high-k dielectric material, and the second dielectric layer is comprised of a low-k dielectric material.

7. The device structure of claim 1 further comprising:
    a second drain comprised of the first semiconductor material;
    a second source comprised of the second semiconductor material; and
    a second tunnel barrier between the second source and the second drain, the second tunnel barrier comprised of the third semiconductor material,
    wherein the first drain, the first source, and the first tunnel barrier are stacked in a first vertical arrangement to comprise a first tunnel field-effect transistor, and the second drain, the second source, and the second tunnel barrier are stacked in a second vertical arrangement to comprise a second tunnel field-effect transistor.

8. The device structure of claim 7 wherein the first vertical arrangement is stacked relative to the second vertical arrangement, and further comprising:
    a first gate electrode adjacent to the first drain; and
    a second gate electrode adjacent to the second source.

9. A design structure readable by a machine used in design, manufacture, or simulation of an integrated circuit, the design structure comprising:
    a drain comprised of a first semiconductor material having a first band gap;
    a source comprised of a second semiconductor material having a second band gap and that exhibits broken-gap energy band alignment with the first semiconductor material; and
    a tunnel barrier between the source and the drain, the tunnel barrier comprised of a third semiconductor material with a third band gap larger than the first band gap and larger than the second band gap,
    wherein the third band gap is configured to bend under an external bias to assist in aligning a first energy band of the first semiconductor material with a second energy band of the second semiconductor material.

10. The design structure of claim 9 wherein the design structure comprises a netlist.

11. The design structure of claim 9 wherein the design structure resides on a storage medium as a data format used for the exchange of layout data of integrated circuits.

12. The design structure of claim 9 wherein the design structure resides in a programmable gate array.

* * * * *